United States Patent [19]

de La Chapelle

[11] Patent Number: 5,013,971
[45] Date of Patent: May 7, 1991

[54] TEMPERATURE STABILIZATION OF LASER DIODES AND LIGHT EMITTING DIODES

[75] Inventor: Michael de La Chapelle, Canoga Park, Calif.

[73] Assignee: Hughes Aircraft Company, Los Angeles, Calif.

[21] Appl. No.: 360,491

[22] Filed: Jul. 21, 1989

Related U.S. Application Data

[63] Continuation of Ser. No. 53,914, May 26, 1987, abandoned.

[51] Int. Cl.⁵ .................. H05B 41/36; H03F 3/04
[52] U.S. Cl. ........................ 315/149; 330/289; 330/296; 315/291
[58] Field of Search ............ 315/149, 158, 156, 157, 315/150, 291; 307/311, 310; 330/289, 296

[56] References Cited

U.S. PATENT DOCUMENTS 4,529,949 7/1985 de Wit et al. .................. 330/289

OTHER PUBLICATIONS

Handbook of Modern Electronics and Electrical Engineering, Charles Belove—A Wiley-Interscience Publication, John Wiley & Sons, TK7825.M38 1986, pp. 256 & 263.
Patent Abstracts of Japan, vol. 11, No. 148 (E-506) [2595], May 14, 1987; & JP-A-61 287 280 (Hitachi Ltd) 17-12-1986 (Whole Document).
W. Schmidt et al.: "Optoelektronik kurz und bundig", 1975, pp. 130-131, Vogel-Verlag, Wurzburg, DE, pp. 130-131; FIG. 5.25.
Patent Abstracts of Japan, vol. 6, No. 189 (E-133) [1067], Sep. 28, 1982; & JP-A-57 102 085 (Nippon Denshin Denwa Kosha) 24-06-1982 (Whole Document).
Siemens-Bauteile-Informationen, vol. 11, No. 1, Apr. 1973, pp. 14-15, Munich, DE; F. Keiner et al.: "Einfache Schaltung zum eliminieren des Temperaturkoeffizienten von Lumineszenzdioden".
Patent Abstracts of Japan, vol. 6, No. 155 (E-125) [1033], Aug. 17, 1982; & JP-A-57 76 884 (Fujitsu K.K.) 14-05-1982, whole document.

Primary Examiner—Eugene R. Laroche
Assistant Examiner—Ali Neyzari
Attorney, Agent, or Firm—C. D. Brown; R. M. Heald; W. K. Denson-Low

[57] ABSTRACT

The optical power emitted from a light energy producing diode is stabilized over temperature using a simple bias circuit consisting of a voltage source with a series resistance or a current source with a shunt resistance. The bias circuit resistance is equal to the slope of the bias line formed by the constant optical power bias points of the diode plotted on a voltage versus current graph. The voltage source or current source value in the bias circuit is equal to the zero current or zero voltage intercept value, respectively.

6 Claims, 2 Drawing Sheets

TEMPERATURE STABILIZATION OF LASER DIODES AND LIGHT EMITTING DIODES

This is a continuation of application Ser. No. 07/053,914, filed May 26, 1987 abandoned.

BACKGROUND OF THE INVENTION

1. Field of the Invention

The present invention relates generally to the operation of optical energy producing semiconductor devices such as laser diodes and light emitting diodes, and, more particularly, to a diode biasing circuit that stabilizes the optical output power over a wide temperature range, and method therefor.

2. Description of Related Art

Laser diodes and light emitting diodes (LED) are in present day widespread use both for military applications as well as in the domestic market for use in compact disc players, autofocus cameras, remote control units and intrusion alarms, to name but a few. These diodes exhibit a relatively wide variation in optical output power as a function of temperature. Although for military or space applications the temperature range within which diodes are required to function is larger, even for domestic uses they may have to operate in a range exceeding 0°–50° Celsius (32°–122° Fahrenheit).

Typically, biasing of lasers and LEDs is accomplished by a constant current source. Also, in order to overcome or alleviate the temperature effect where optical power output is desired to be relatively constant, at the present time it is conventional to use feedback circuits which sense any changes in optical power output and adjust the bias current accordingly. Although feedback stabilization bias circuits are effective for maintaining the optical output very precisely, they are relatively expensive and too bulky for many applications.

SUMMARY OF THE INVENTION

It is a fundamental feature of the present invention that for each prescribed optical output power level of an optical energy producing diode, there is an optimum bias line for achieving this prescribed optical output power over a wide temperature range. One aspect of the invention is a bias circuit which causes the diode to operate on the optimum bias line to maintain a constant optical output power, which bias circuit can optionally consist of a voltage source version or a current source version. A further aspect of the invention is a method for determining the optimum bias line for any optical energy producing diode. The slope and intercepts of the optimum bias line define the component values of the bias circuit.

In the practice of the method of this invention, to determine the value of the biasing voltage (or current) and the electrical resistance to be inserted into the biasing path, the diode is electrically biased to provide the desired amount of optical output at a fixed environmental temperature. This operation is repeated several times at different temperatures and the bias points are plotted on an I-V graph forming a bias line that provides temperature stabilization of the diode optical output power. The slope of the bias line is the optimum bias circuit resistance and the zero axis intercepts the power supply voltage or current, as the case may be. When this biasing circuit is connected with the diode, the optical output is maintained substantially constant over a wide temperature range. The invention may also be accomplished using a constant current source, in which case the stabilizing resistance is shunted about the diode.

Whether to practice the present invention by utilizing a voltage source or a current source is determined primarily by the amount of power dissipation expected in the bias resistor. Where the resistance is a relatively high value, it is advisable to use a current source and shunt the resistor about the diode. On the other hand, where the bias resistor is a relatively low value, it is advisable to use a voltage source with a series resistance to the diode.

DESCRIPTION OF THE PREFERRED EMBODIMENTS

Figure 1A:
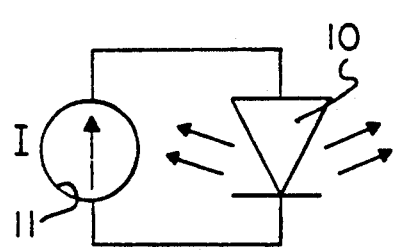
FIG. 1A is a prior art schematic of constant current biasing of an optical energy producing diode.
Figure 1B:
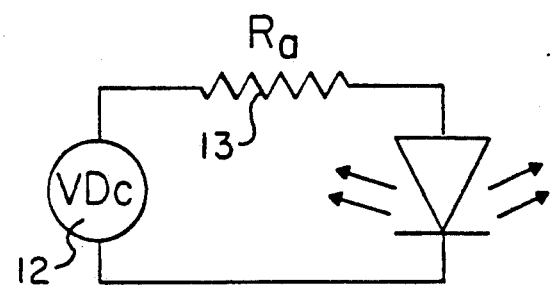
FIG. 1B is a prior art circuit to bias a diode for simple display purposes.

Turning now to the drawing and particularly FIG. 1A, there is shown a typical prior art energizing circuit for an optical energy producing semiconductor diode 10 such as a so-called laser diode or a light emitting diode (LED). Energizing power has conventionally been provided by a constant current source 11 where it is not necessary to stabilize the optical output power. The optical output, however, is found to vary considerably with diode temperature. For example, one commercially available diode under constant current biasing provides approximately 1.9 milliwatts at 32° Fahrenheit (0° Celsius) and only 0.9 milliwatts at 70° F. (21° C.).

Where diodes are used as simple display devices, for example, variation in light output is not important and diode temperature stability is of minor concern. However, there are other applications such as optical fiber transmitters for telecommunications links where temperature stability is mandatory.

Where diodes are used for simple display applications it is common practice to employ a voltage source 12 with a series resistance (Ra) for diode biasing as depicted in FIG. 1B. This technique is adopted primarily because a constant current bias is too expensive for simple display applications. Accordingly, a series resistance is chosen of appropriate value to merely deliver an effective value current to the diode. There has been no thought or appreciation in the past of using a series resistance to achieve temperature stabilization.

Figure 1C:
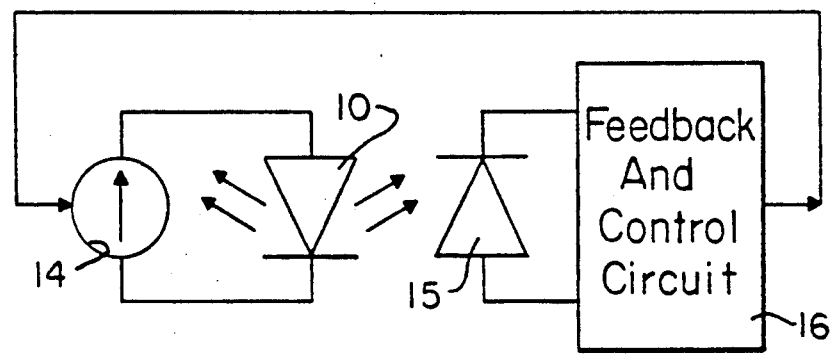
FIG. 1C is a schematic circuit of a prior art feedback control circuit for a diode to obtain optical output stabilization over a temperature range.

Diode temperature stabilization has been achieved by a feedback arrangement in the past as depicted in FIG. 1C. As shown there, the diode 10 is primarily biased by a controllable current source 14. In addition, the diode output is directed onto a back plane photodiode 15 interconnected with a null-balance feedback control circuit 16. In this way, temperature induced changes in the optical output power are compensated for by increasing or decreasing the biasing current, as the case may be. Although this method provides excellent stability, feedback stabilization is relatively expensive, and, for certain applications, too bulky.

It is a fundamental feature and aspect of the present invention to provide an energization circuit for a laser or light emitting diode maintaining a predetermined constant optical energy output over an extended temperature range, which circuit accomplishes this goal simply, relatively inexpensively and without relying on feedback techniques.

Figure 4:
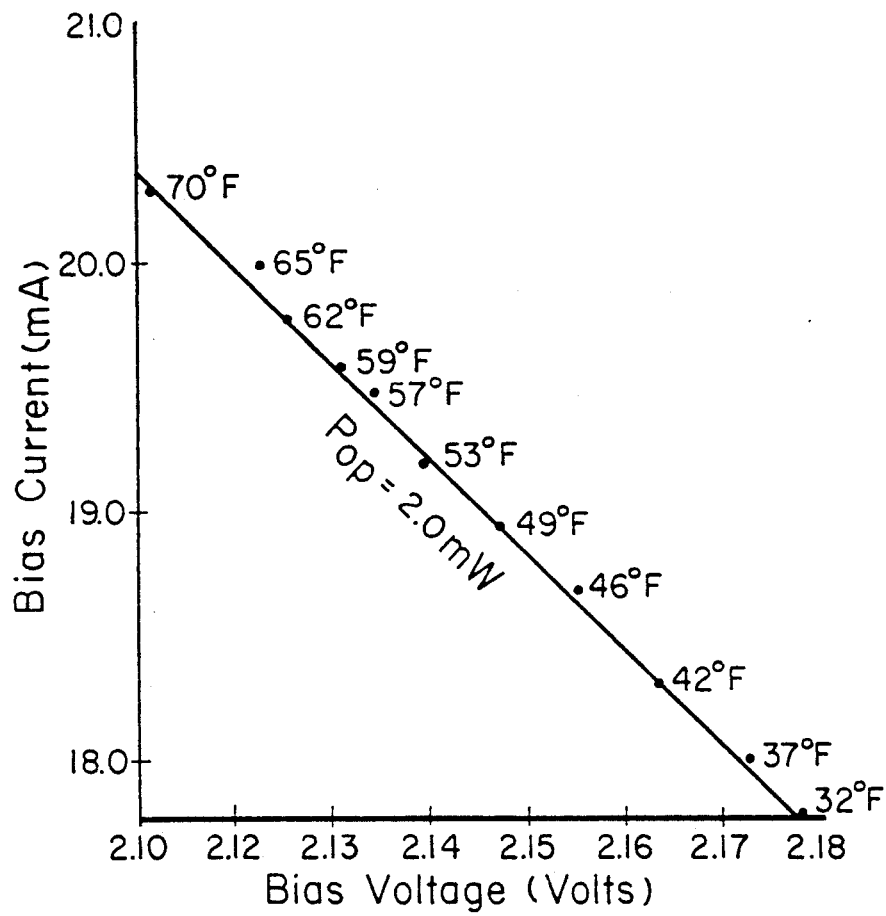
FIG. 4 is an I-V graph for constant optical output power at various temperatures.

Turning now to FIG. 4, there is shown a graph of diode bias current and voltage over a temperature range of 32°–72° F. (0°–22° C.) for a constant optical output. More particularly, the graph shows values of D.C. biasing voltage and current for a given laser diode to produce 2.0 milliwatts of optical output power at a number of different temperatures.

The FIG. 4 graph is formed from data made on a GaAlAs laser diode manufactured and sold under the trade designation LDS10 by Ortel Corporation, Alhambra, Calif. The straight line curve is actually a best-fit line drawn through the various I-V measurement points made at the indicated temperatures. This bias line has been determined to represent the optimum bias line for minimizing optical output power variations with temperature. It has also been found that the optimum bias line changes for different optical output power levels.

Figure 2:
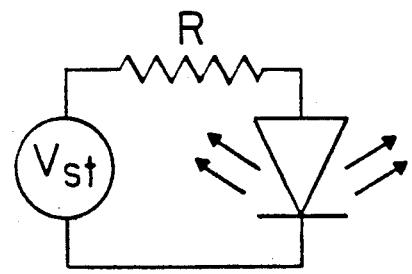
FIG. 2 is a schematic depiction of the circuit of this invention with a biasing voltage and a series resistance determined by the method of the invention.

From the FIG. 4 graph, the value of the bias voltage for zero current (i.e., open circuit voltage) was found to be 2.403 volts. Also, the inverse slope of the bias line defines a resistance, Rst, equal to 12.4 ohms. These are, respectively, the values of a constant bias voltage source and series resistance for a diode energization circuit to achieve the predetermined constant optical output (i.e., 2.0 mw) stabilized over a wide temperature range (FIG. 2).

Figure 5:
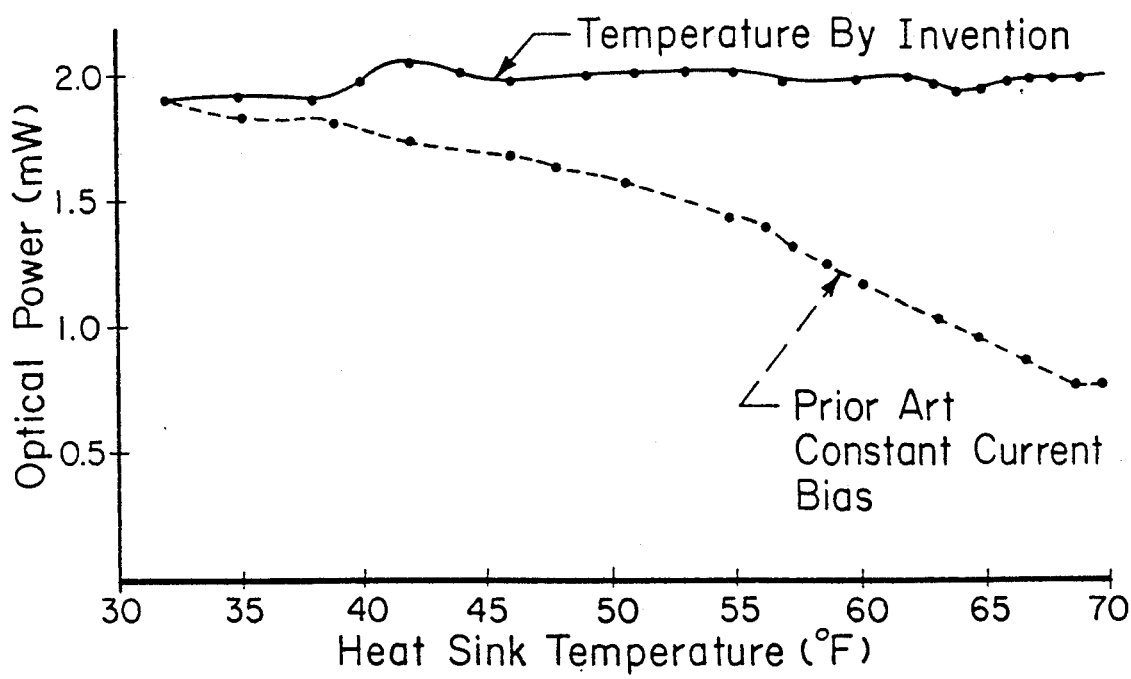
FIG. 5 is a graph comparing the optical output power versus temperature for operation under the invention as compared with the prior art constant current bias.

In a practical operating construction of the invention, a D.C. voltage source of 2.403 volts was applied through a 12.4 ohm series resistor to bias an LDS10 diode. The diode was maintained in contact with a heat sink which was varied in temperature. For comparison, an identical diode was biased by a constant current of 20.4 milliamperes while a heat sink in contact with the diode was similarly varied in temperature. The optical energy output of each diode was measured and plotted. As FIG. 5 shows, the bias circuit of the invention is highly constant at approximately 2.0 milliwatts throughout the entire temperature range, while the constant current bias controlled diode drops off in light output as the temperature increases until it is approximately 0.75 milliwatts at about 68° F.

Figure 3:
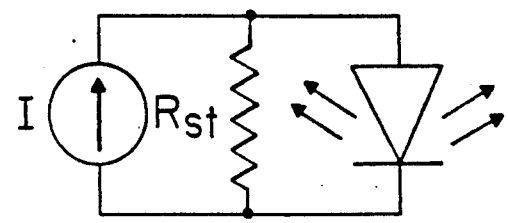
FIG. 3 is an alternate embodiment of the invention in which the diode is biased by a constant current source.

In the first described embodiment an appropriate voltage was determined for use with Rst to bias the diode to constant light output. As an alternative, a circuit as in FIG. 3 can be used where the same resistance Rst (i.e., 12.4 ohms) is shunted about the diode and bias is provided by a constant current source equal to the current at the voltage zero intercept (i.e., V=0) taken from FIG. 4.

The choice between using the invention with a voltage source (FIG. 2) or a current source (FIG. 3) depends primarily upon the expected power dissipation in the bias resistor Rst. Although stabilization of optical output can be achieved by utilizing either a voltage or current source, it is usually advisable to employ the one exhibiting the least power dissipation across the resistor if only in the interest of driving power conservation.

What is claimed is:

1. A nonfeedback stabilized bias circuit for an optical energy emitting semiconductor diode producing a predetermined constant optical energy output over a given temperature range, comprising:
   a DC voltage source having a constant voltage value substantially equal to the zero current intercept of a best-fit straight line for a plurality of bias points on a voltage-current graph of said diode for producing the predetermined optical energy output at respectively different temperatures; and
   a fixed value resistor serially interconnected with said constant voltage source and said diode, said resistor having a value in ohms equal to a change in voltage over a certain portion of said best-fit straight line divided by the change in current over said certain portion;
   the current through the optical energy emitting diode being maintained solely by said resistor within the necessary range to produce said predetermined constant optical energy output.

2. A nonfeedback stabilized bias circuit for an optical energy emitting semiconductor diode producing a predetermined constant optical energy output over a given temperature range, comprising solely:
   a DC electrical energy source providing a constant current of a value substantially equal to the zero voltage intercept of a best-fit straight line for a plurality of bias points on a voltage-current graph of said diode for producing the predetermined constant optical energy at respectively different temperatures;
   a fixed value resistor for interconnecting said DC electrical energy source with said diode, said resistor being of a value in ohms equal to the ratio of a change in voltage along a portion of the straight line voltage-current graph to the current change along said certain portion.

3. A method of determining the constant value of power supply voltage and a fixed value serial resistor solely forming a nonfeedback stabilized bias circuit for a semiconductor diode to maintain optical energy output of a predetermined constant power level over an ambient temperature range, comprising the steps of:
   cyclically establishing the diode at each of a plurality of different ambient temperatures;
   electrically biasing the diode at each of its different temperatures to provide said predetermined constant power level;
   recording the current and voltage bias values;
   forming an X-Y voltage versus current graph of bias values for each temperature;
   forming a best-fit straight line on the graph of said bias values;
   determining the zero current voltage intercept of the straight line, said zero current voltage being the power supply voltage for the bias circuit; and
   ratioing a change in voltage over a portion of the straight line graph to the change in current over said portion, said ratio value in ohms being the value of the bias circuit serial resistor.

4. A method of determining the values of constant voltage and a fixed value serial resistor together solely forming a nonfeedback stabilized bias circuit for a semiconductor diode to maintain optical energy output of a predetermined constant power level over an ambient temperature range, comprising the steps of:

sequentially establishing the diode to each of a plurality of different ambient temperatures;

biasing the diode at each of its different ambient temperatures to provide the predetermined constant optical power level;

measuring the voltage and current values at each of the diode different temperatures which produce the predetermined constant power level;

recording the voltage and current values on a voltage-current Cartesian graph;

drawing a best-fit straight line through the graph voltage and current values; and extending the straight line, at one end thereof, until it intercepts the zero current axis whereat the desired power supply voltage value is defined, the inverse slope of said straight line being the value of the desired series resistor.

5. A method of determining the values of a nonfeedback stabilized bias circuit consisting solely of a constant current bias and a fixed value resistance shunt about an optical energy emitting diode to achieve a relatively constant predetermined optical power output throughout an ambient temperature range, comprising:

sequentially bringing the diode to a plurality of different temperatures within said temperature range;

biasing the diode while at each of the different temperatures to produce the predetermined optical power output;

recording the diode biasing for each temperature on a voltage-current graph;

forming a line on the graph generally symmetrically to and along the recorded biasing, which line extends to the zero voltage point whereat the desired constant current is defined and the slope of the line defining in ohms the resistance shunt.

6. A method for optimally stabilizing the optical energy output about a constant value of a semiconductor diode over a temperature range, comprising the steps of:

locating a plurality of voltage-current points on a graph, each point of which corresponds to biasing necessary to stabilize the diode output for a particular temperature;

drawing a best-fit straight line through the voltage-current points;

extrapolating the line to intersect the voltage point corresponding to zero current; and biasing the diode with a nonfeedback stabilized bias circuit consisting solely of a constant voltage equal to the voltage point through a fixed value series resistor of such value as to stabilize the optical energy output at said value.

* * * * *